(12) United States Patent
Liaw

(10) Patent No.: US 6,891,745 B2
(45) Date of Patent: May 10, 2005

(54) DESIGN CONCEPT FOR SRAM READ MARGIN

(75) Inventor: Jhon-Jhy Liaw, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 163 days.

(21) Appl. No.: 10/290,622

(22) Filed: Nov. 8, 2002

(65) Prior Publication Data

US 2004/0090818 A1 May 13, 2004

(51) Int. Cl.$^7$ ............................................. G11C 11/00
(52) U.S. Cl. .................. 365/154; 365/156; 365/230.06; 365/226
(58) Field of Search ................................ 365/154, 156, 365/230.06, 226

(56) References Cited

U.S. PATENT DOCUMENTS

| | | | |
|---|---|---|---|
| 5,726,932 A | 3/1998 | Lee et al. ................... | 365/154 |
| 5,757,696 A | 5/1998 | Matsuo et al. ......... | 365/185.07 |
| 6,157,558 A | 12/2000 | Wong ........................ | 365/49 |
| 6,266,269 B1 | 7/2001 | Karp et al. ................. | 365/150 |
| 6,683,805 B2 * | 1/2004 | Joshi et al. ................. | 365/156 |
| 2002/0186581 A1 * | 12/2002 | Yamaoka et al. ........... | 365/154 |

* cited by examiner

Primary Examiner—Huan Hoang
(74) Attorney, Agent, or Firm—Thomas, Kayden, Horstemeyer & Risley

(57) ABSTRACT

A new method to improve the reading margin in a SRAM memory array is achieved. The method comprises providing an array of SRAM cells. Each SRAM cell has a power supply terminal. A first voltage is forced on the power supply terminal of a first SRAM cell that is selected for reading. A second voltage is forced on the power supply terminal of a second SRAM cell that is not selected for reading. The first voltage does not equal the second voltage. A new SRAM device featuring this method is disclosed.

28 Claims, 5 Drawing Sheets

US 6,891,745 B2

DESIGN CONCEPT FOR SRAM READ MARGIN

BACKGROUND OF THE INVENTION (1) Field of the Invention

The invention relates to a memory device, and, more particularly, to a method to improve the reading margin in a SRAM device.

(2) Description of the Prior Art

Static memory devices (SRAM) are used in a wide variety of electronics applications. SRAM devices provide a randomly accessible memory array where the data contents can be written and re-written at any time. Further, the SRAM storage cells are constructed such that the static operating current is very low.

Referring now to FIG. 1, an exemplary SRAM memory cell 10 is shown in circuit schematic form. A typical SRAM cell 10 comprises six transistors (6T). A cross-coupled inverter pair N1 22, P1 14, N2 26, and P2 18 and access transistors N3 30 and N4 34 make up the cell 10. The cell is powered by a supply VCC 54. During a write operation, a write data state is set by forcing complimentary voltages (0 and 1) on the bit line (BL) 50 and bit line bar (BLB) 46 lines. Then the access transistors N3 and N4 are turned ON by forcing the word line signal (WL) 48 high. This allows the data state to be forced into the cross-coupled pair. The access transistors are then turned OFF. The positive feedback of the cross-coupled pair will insure that the new data state is maintained.

Typically, the memory cell 10 is replicated many times on the SRAM device to form a large array of SRAM memory cells. Referring now to FIG. 2, a portion of such an array 100 is shown. Four SRAM cells CELL00 101, CELL01 113, CELL10 125, and CELL11 137 are arranged in an array. In general, the overall SRAM array 100 may contain millions of such cells. Each SRAM cell comprises the same 6T arrangement as shown in FIG. 1. The cells 101, 113, 125, and 137 are accessed using the word line signals WL0 156 and WL1 158 and the bit line signals BL0 162, BLB0 160, BL1 166, and BLB1 164. Several features should be noted in the prior art memory array. First, the word lines WL0 and WL1 are coupled to more than one cell. For example, WL0 156 is coupled to both CELL00 101 and CELL01 113. Therefore, the access transistors for both cells are turned ON at the same time during a reading or writing event. In general, a larger sub-array of cells would have a common word line. Further, the bit line signals BL0, BLB0, BL1, and BLB1 are coupled to more than one cell. For example, the complimentary bit line signals BLB0 160 and BL0 162 are coupled to both CELL00 101 and CELL10 125. These bit line signals can be shared by a large number of cells because only one row of cells, those with the same word line, are accessed at any time. The access transistors for non-selected cells are turned OFF since the word lines for those rows are not asserted. Of particular importance to the present invention is the fact that all of the memory cells 101, 113, 125, and 137 in the memory array 100 are powered by the same power supply VCC 152.

Referring now to FIG. 3, an exemplary SRAM architecture is shown. The entire SRAM array 100 may include millions of cells. The word line decoder 170 controls all of the word line signals WL(0:n) 178 for the array 100 where the array contains a total of n+1 rows of cells. The bit line decoder 174 controls all of the bit line signals, shown as BL(0:m) 182 and implying both BL and BLB compliments, where the array contains a total of m+1 columns of cells. The word line and bit line decoders 170 and 174 respond to the command state (READ or WRITE), the address state, and the data state of the SRAM to assert the correct word line WL(0:n) 178 and to either drive the bit lines BL(0:m) 182 to the correct WRITE state or to READ the stored state of the selected cells. Again, the entire SRAM array is powered by a single supply level VCC 152.

Design rules continue to shrink for high density and high performance SRAM devices. As a result, the operating voltage, VCC, of these devices must be reduced to maintain the thermal stability and reliability and to reduce power consumption. However, as the power supply voltage, VCC, is reduced to below about 1.2 Volts, SRAM cell operation can be adversely affected. In particular, a very low VCC level can cause soft errors. Soft errors occur due to the small VCC level reducing the cell reading margin. In a soft error, a SRAM cell that has correctly maintained the cell state will, nevertheless, be incorrectly read by the sensing circuit due to random effects, such as noise, that cannot be overcome due to insufficient margin. In this case, the benefits of a reduced VCC level described above, are offset by the increase in soft error rate.

Several prior art inventions relate to memory devices. U.S. Pat. No. 6,266,269 B1 to Karp et al discloses a memory device comprising an array of three terminal, nonvolatile memory cells. The word lines of the cells are driven by a circuit powered by the VCC line. U.S. Pat. No. 6,157,558 to Wong describes a content addressable memory cell structure based on an SRAM cell. A mask control circuit is used to ground all mask lines. U.S. Pat. No. 5,726,932 to Lee et al illustrates a SRAM cell structure. U.S. Pat. No. 5,757,696 to Matsuo et al teaches a nonvolatile memory cell based on a 6T structure including two floating gate devices.

SUMMARY OF THE INVENTION

A principal object of the present invention is to provide an effective and very manufacturable method to improve the read margin of a SRAM device.

A further object of the present invention is to provide a method to improve the read margin of a SRAM device while maintaining a low operational supply voltage.

A yet further object of the present invention is to provide a method to selectively increase the cell power supply voltage during a reading access to thereby increase the reading margin.

Another further object of the present invention is to provide a SRAM device having an improved reading margin.

In accordance with the objects of this invention, method to improve the reading margin in a SRAM memory array is achieved. The method comprises providing an array of SRAM cells. Each SRAM cell has a power supply terminal. A first voltage is forced on the power supply terminal of a first SRAM cell that is selected for reading. A second voltage is forced on the power supply terminal of a second SRAM cell that is not selected for reading. The first voltage does not equal the second voltage.

Also in accordance with the objects of this invention, a SRAM memory array device comprising an array of SRAM cells. Each SRAM cell has a power supply terminal. A means is provided for forcing a first voltage on the power supply terminal of a first SRAM cell that is selected for reading. A means is provided for forcing a second voltage on the power supply terminal of a second SRAM cell that is not selected for reading. The first voltage does not equal the second voltage.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to improve the reading margin in a SRAM memory device. The method provides a means to control the power supply voltage such that the power supply voltage on cells selected for a reading access can be made larger than the power supply voltage on non-selected cells. It should be clear to those experienced in the art that the present invention can be applied and extended without deviating from the scope of the present invention.

Figure 1:
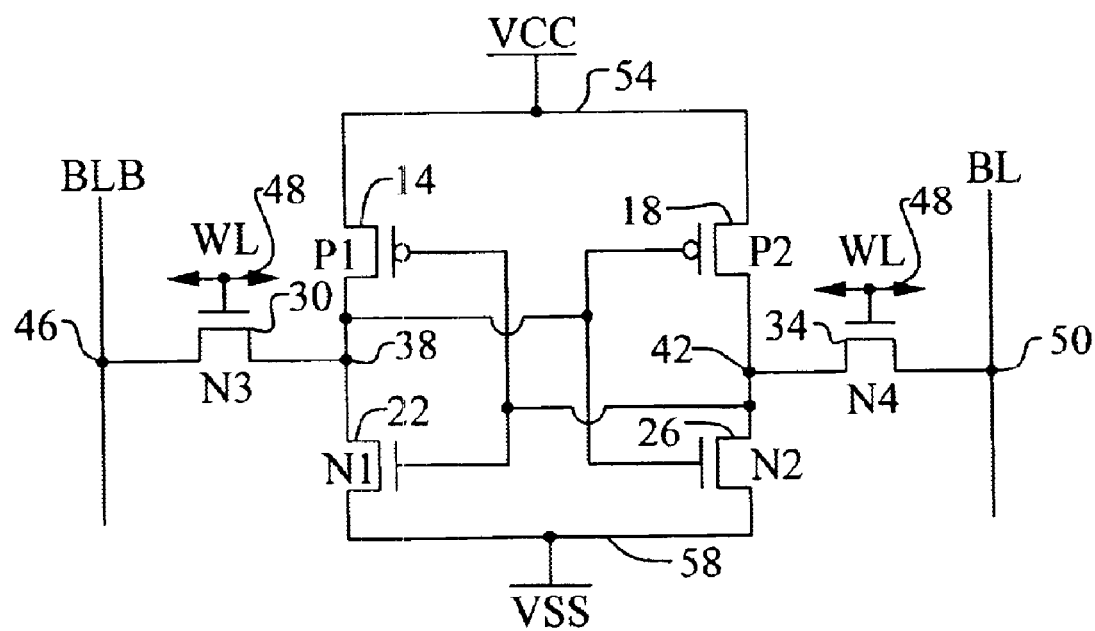
FIG. 1 illustrates an exemplary SRAM cell.
Figure 4:
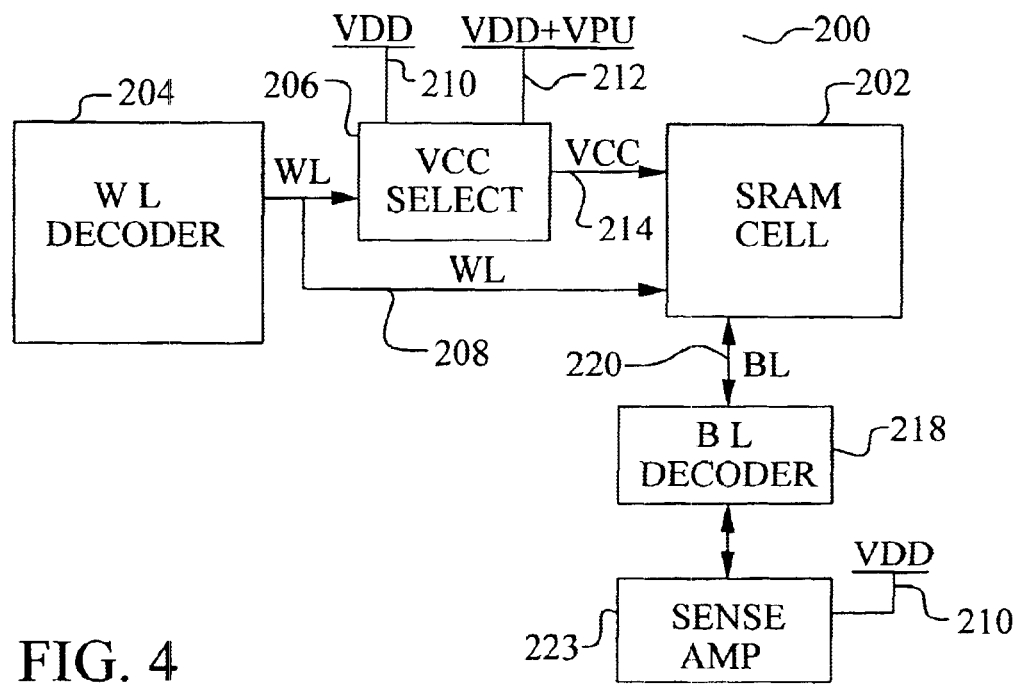
FIG. 4 illustrates a preferred embodiment of the present invention.

Referring now to FIG. 4, the preferred embodiment of the present invention is illustrated. Several important features of the present invention are shown and discussed below. The basic concept 200 of the invention is shown. A single SRAM cell 202 is depicted. This SRAM cell 202 may comprise any type of cell architecture known in the art such as 4T or 6T. More preferably, the SRAM cell 202 comprises a 6T architecture as shown in FIG. 1. Referring again to FIG. 4, the SRAM cell 202 is controlled by the word line WL 208 and the bit line BL 220 as described in the prior art analysis above. The complimentary bit line signal, BLB, is assumed but not shown for simplification. A Sense Amplifier circuit 223 is used to detect the state of the SRAM Cell 202 during a reading event.

An important additional element is added to the basic architecture. A power supply selection block, VCC Select 206, is provided. The VCC Select block 206 is used to control the power supply level, VCC 214, to the SRAM block 202. As is discussed above, it is desirable to reduce the VCC level 214 for a very small dimension (deep sub-micron) circuit device to thereby improve the reliability and thermal stability while reducing the power consumption. However, it is also found that this reduced power supply level will reduce the cell reading margin and thereby result in soft errors.

The present invention improves the reading margin of the SRAM cell while maintaining much of the benefit of the reduced voltage supply level. The power supply terminal VCC 214 of the SRAM cell 202 is coupled to the VCC Select circuit 206. This VCC Select circuit 206 is essentially a multiplex circuit having two voltage input levels, VDD 210 and VDD+VPU 212, a selection signal, WL 208, and a voltage output level, VCC 214. The method of the present invention works by selecting a first voltage level, VDD+VPU 212, as the SRAM cell 202 supply VCC 214 when the SRAM cell 202 is selected for a read and by selecting a second voltage level, VDD 210, as the SRAM cell supply VCC 214 when the SRAM cell 202 is not selected for a read. By this technique, the performance of the SRAM cell 202 can be optimized by selecting an optimal reading voltage, VDD+VPU 212, and an optimal non-reading, operating voltage, VDD 210. It is important to note that all other circuits in the device 200, and especially the Sense Amplifier 223, are always powered by the second supply VDD 210. Only the SRAM Cell 202 power supply VCC 214 toggles between the two supply levels 210 and 212.

In the preferred embodiment, the second voltage, VDD 210 is selected to optimize the reliability, thermal stability, and operating power of the cell 202 for the process technology. The first voltage, VDD+VPU 212, preferably comprises the sum of the second voltage, VDD 210, and an additional voltage VPU. This first voltage, VDD+VPU 212 is preferably greater than the second voltage, VDD 210, and may be generated from the VDD voltage using a charge pump circuit. For example, VDD+VPU may equal between about 1.05 times the VDD voltage and about 1.3 times the VDD voltage.

In the preferred embodiment, the selection signal for the VDD Select circuit 206, comprises the word line WL 208 signal for that cell 202. Whenever the SRAM cell 202 is selected for a reading operation, WL 208 will be asserted to turn ON the selection transistors of the SRAM cell 202 as discussed above. At that same time, the power supply VCC 214 of the cell 202 is increased to the VDD+VPU level 212 to thereby increase the reading margin for the cell. The use of the WL 208 signal to control the cell power supply VCC 214 is only one possible method.

By increasing the power supply VCC 214 during the reading operation, the static read, noise margin is increased for the cell 202. For example, an analysis of the static read margin and static write margin of an SRAM cell 202 is shown below in Table 1. In this analysis, the second supply level, VDD, is swept across a range from about 0.7 Volts to about 1.3 Volts. Meanwhile, the first supply level, VDD+VPU is also swept across the range from about 0.7 Volts to about 1.3 Volts. The resulting noise margin performance is normalized to the condition where both VDD and VDD+VPU are equal at about 1.0 Volts to simulate the prior art condition. The analysis shows that establishing a higher power supply voltage, VDD+VPU 212, in the SRAM cell 202 while maintaining a lower supply voltage, VDD 210, in all other circuits causes the static read, noise margin to improve. For example, a VDD level of about 1.0 Volts and a VDD+VPU level of about 1.2 Volts results in a read noise margin of about 143% when compared to the normalized result. In all cases, a higher VDD+VPU level improves the read noise.

TABLE 1

SRAM cell read static noise margin
(normalized to margin at 1.0 V on both VDD and VDD + VPU).

| | VDD | | | | | | |
|---|---|---|---|---|---|---|---|
| VDD + VPU | 0.7 V | 0.8 V | 0.9 V | 1.0 V | 1.1 V | 1.2 V | 1.3 V |
| 0.7 V | 76% | | | 13% | | | |
| 0.8 V | | 86% | | 44% | | | |
| 0.9 V | | | 94% | 74% | | | |
| 1.0 V | 157% | 139% | 120% | 1 | 80% | 61% | 41% |
| 1.1 V | | | | 123% | | | |
| 1.2 V | | | | 143% | | | |
| 1.3 V | | | | 161% | | | |

As shown above, the preferred embodiment uses the word line WL 208 signal to select the VCC voltage 214 for the SRAM cell 202. As a result, the embodiment actually selects the VDD+VPU level during either a read operation or a write operation on the SRAM cell 202. Therefore, the cell 202 power supply VCC 214 is changed to VDD+VPU during the writing operation. The effect of this is shown below in Table 2. It is found that the SRAM cell writing margin declines as the VDD+VPU level is increased with respect to the VDD level. However, it is also found that the writing margin for the exemplary SRAM design is inherently larger than the reading margin. Therefore, it is possible to trade away the higher writing margin while achieving a higher reading margin. For example, if the VDD+VPU level is selected at 1.2 Volts while the VDD level is selected at 1.0 Volts, then the reading margin is about 143% of the prior art while the writing margin is about 138% of the reading margin of the prior art. Therefore, an improved reading margin is achieved while still maintaining an acceptable writing margin using the preferred approach wherein the word line signal is used to select the VCC level for the SRAM cell.

TABLE 2

SRAM cell write static noise margin
(normalized to read margin at 1.0 V on both VDD and VDD + VPU).

| | VDD | | | | | | |
|---|---|---|---|---|---|---|---|
| VDD + VPU | 0.7 V | 0.8 V | 0.9 V | 1.0 V | 1.1 V | 1.2 V | 1.3 V |
| 0.7 V | 108% | | | 294% | | | |
| 0.8 V | | 135% | | 248% | | | |
| 0.9 V | | | 162% | 217% | | | |
| 1.0 V | 27% | 81% | 136% | 190% | 245% | 301% | 359% |
| 1.1 V | | | | 163% | | | |
| 1.2 V | | | | 138% | | | |
| 1.3 V | | | | 113% | | | |

Figure 2:
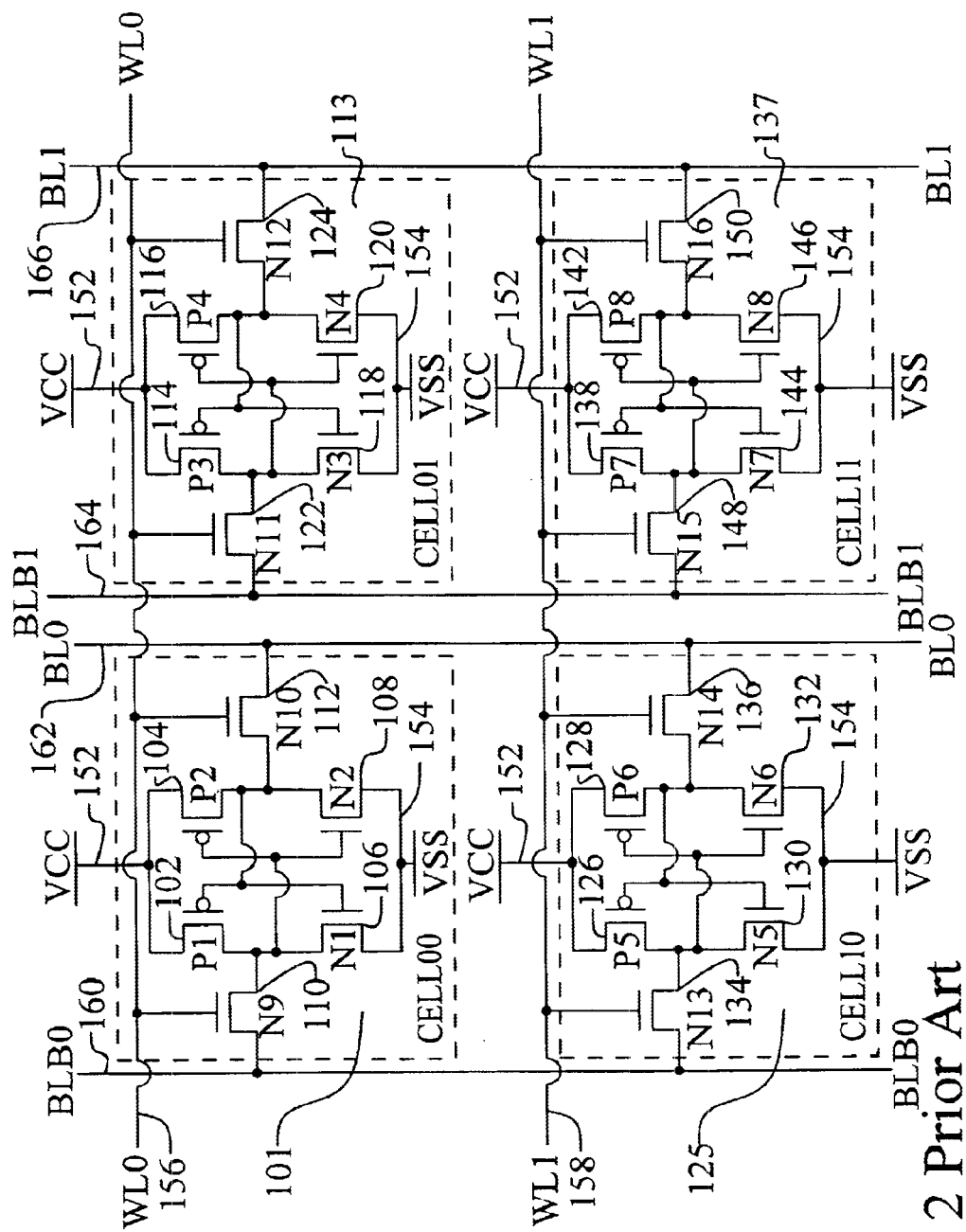
FIG. 2 illustrates a portion of an exemplary SRAM memory array.
Figure 3:
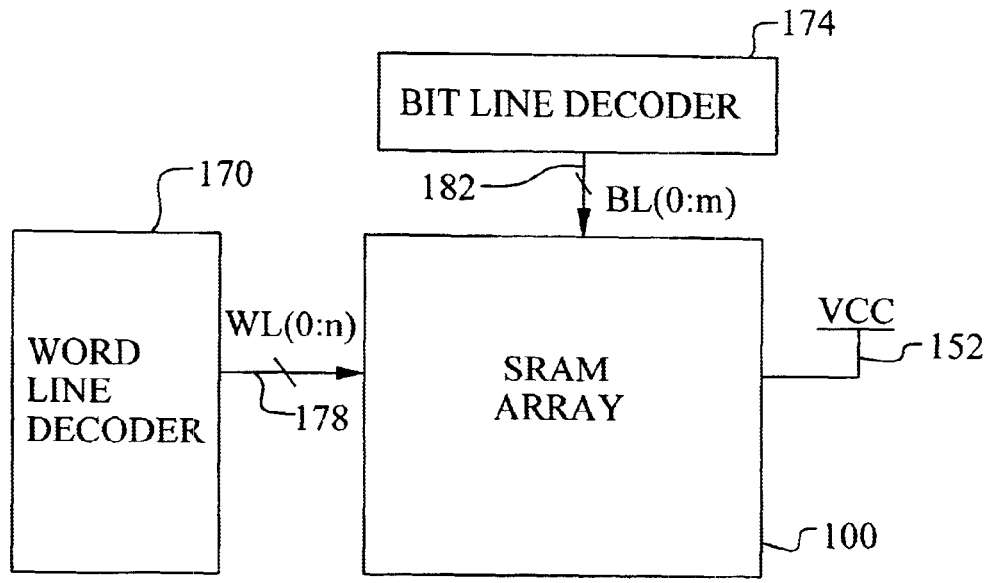
FIG. 3 illustrates an exemplary SRAM device.
Figure 5:
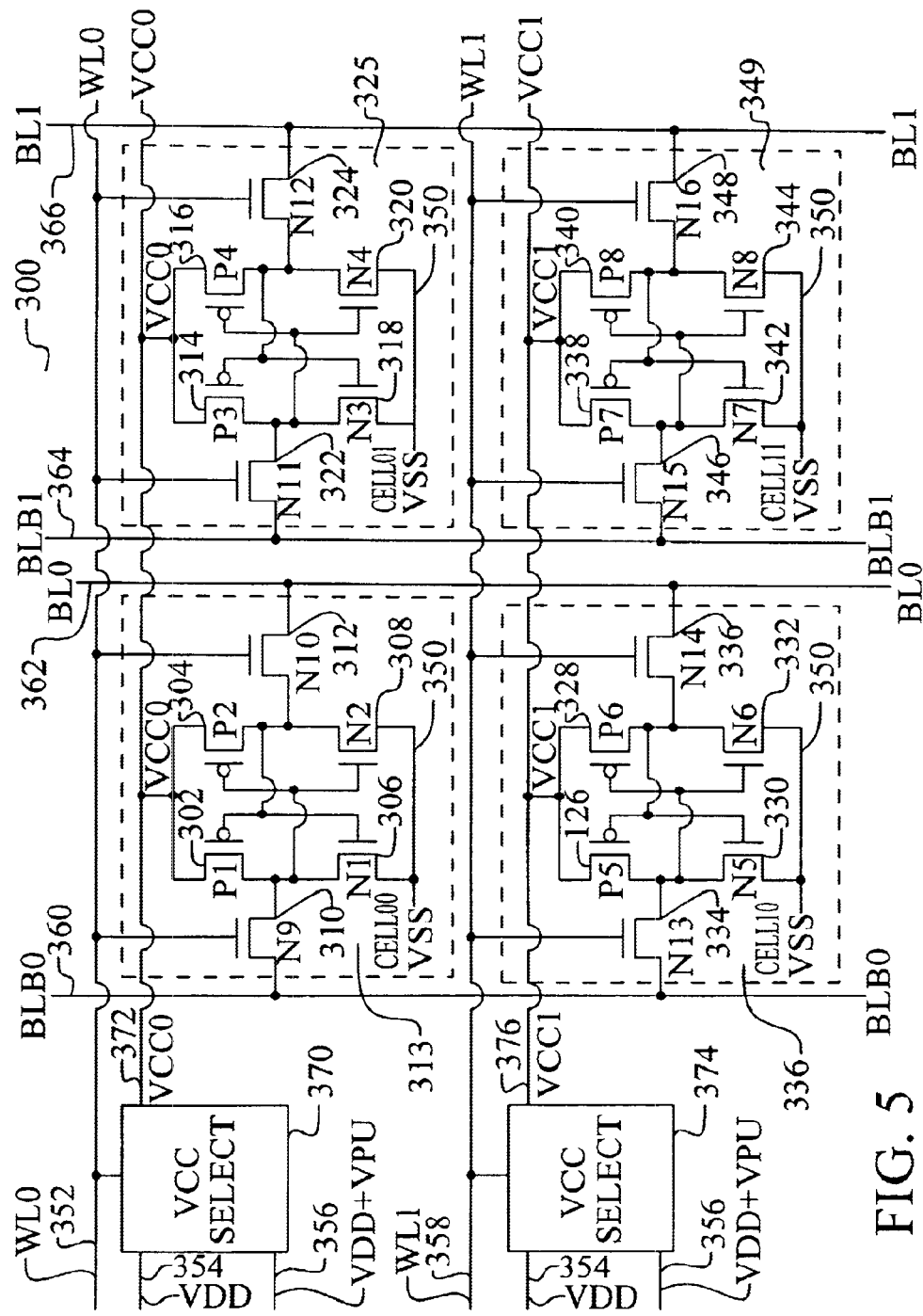
FIG. 5 illustrates the preferred embodiment of the present invention showing a portion of a SRAM memory array.

Referring now to FIG. 5, the preferred embodiment is shown in schematic form. As in the prior art analysis FIG. 2, a part of a SRAM array 300 is depicted. Once again, four cells, CELL 00 313, CELL01 325, CELL10 336, and CELL11 349 are shown. Each of these SRAM cells comprises a 6T configuration as discussed above. CELL00 313 comprises transistors P1 302, P2 304, N1 306, N2 308, N9 310, and N10 312. Similarly, CELL01 325 comprises P3 314, P4 316, N3 318, N4 320, N11 322, AND N12 324, CELL10 336 comprises P5 326, P6 328, N5 330, N6 332, N13 334, and N14 336, and CELL11 349 comprises P7 338, P8 340, N7 342, N8 344, N15 346, and N16 348. The general read/write operation of the cells in the array 300 uses the word lines WL0 352 and WL1 358 and the bit lines BLB0 360, BL0 362, BLB1 364, and BL1 366 as discussed in the prior art analysis.

Several key features of the present invention should be noted. First, a single, global power supply is not used. Rather, a common supply is provided for each row of cells. For example, CELL00 313 and CELL01 325 are coupled to power supply VCC0 372. Similarly, CELL10 336 AND CELL11 349 are coupled to power supply VCC1 376. Second, the row power supplies 372 and 376 are each controlled by a VCC Select circuit 370 and 374. Third, the VCC Select circuits 370 and 374 select between the input voltages, VDD 354 and VDD+VPU 356 based on the state of the word line, WL0 352 or WL1 358, for that row. For example, if WL0 352 is asserted to select ROW0 for a read, then the ROW0 VCC Select circuit 370 selects VDD+VPU 356 as the VCC0 372 level for CELL00 313 and CELL01 325. In this case, WL1 358 will be non-asserted since ROW1 is not selected. Therefore, VCC Select 374 will select VDD 354 as the VCC1 voltage for CELL10 336 and CELL11 349. Fourth, this concept is easily extendible across the entire array 300. In that case, the selected row of cells that correspond to WL0 is a selected, sub-array of the overall array 300. All other rows of cells, including those that correspond to WL1, are a non-selected sub-array of the overall array 300.

Figure 6:
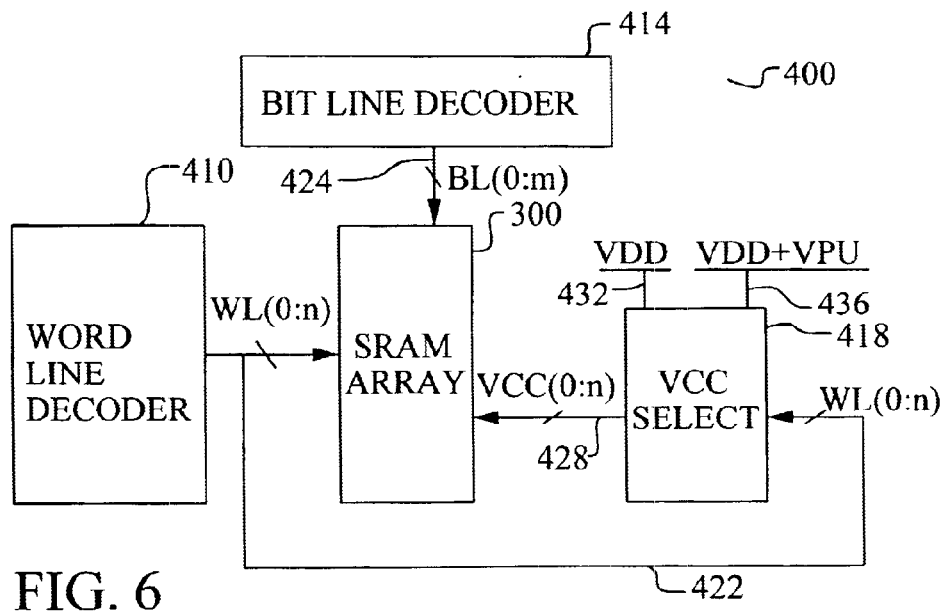
FIG. 6 illustrates the preferred embodiment of the present invention showing a SRAM device.

Referring now to FIG. 6, the preferred embodiment is shown as extended across the entire array. The SRAM array 300 may comprise a large array of SRAM cells having n+1 rows and m+1 columns where each row has a common word line and each column has a common bit line. The word line decoder 410 controls the word line signals, WL(0:n) 422. The bit line decoder 414 controls the bit line signals, BL(0:m) 424. Again, the BLB signals are assumed by not shown. In this architecture, the VCC Select circuits are combined into a single block called VCC Select 418. Again VCC Select 418 uses the word line signals WL(0:n) 422 to select the power supply signals for each row, VCC(0:n) 428, from the two input supplies, VDD 432 and VDD+VPU 436.

Figure 7:
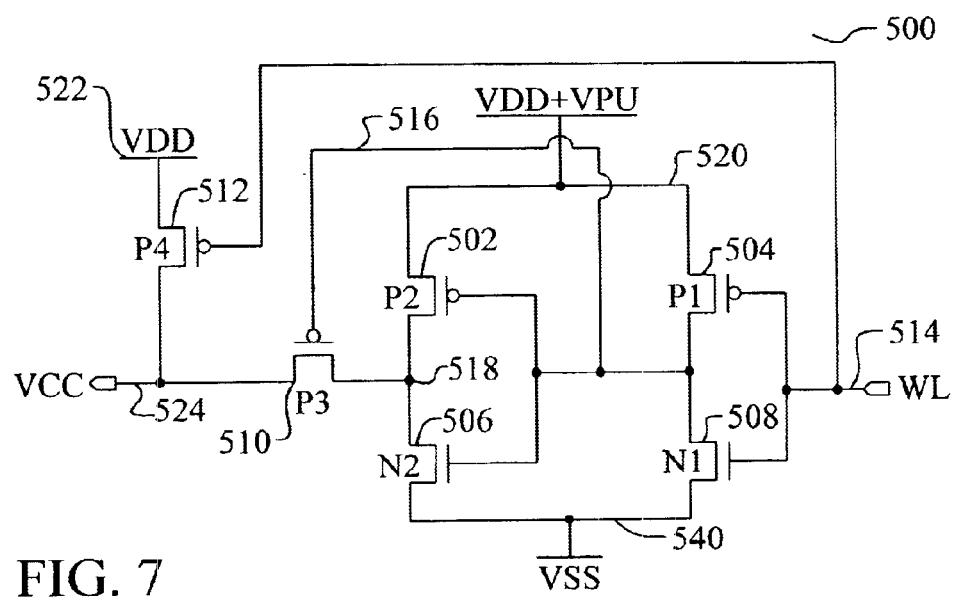
FIG. 7 illustrates a preferred embodiment of the common power supply control circuit.

Referring now to FIG. 7, a preferred embodiment of a VCC Select circuit 500 for a single row is shown. The circuit 500 uses the input signal WL 514 to select which supply level, VDD 522 or VDD+VPU 520, is coupled to the VCC output 524. The circuit comprises a first inverter P1 504 and N1 508, a second inverter P2 502 and N2 506, and two transistors P3 510 and P4 512. More specifically, the input of the first inverter is coupled to the word line, WL 514, for the row. The first inverter P1 504 and N1 508 and the second inverter P2 502 and N2 506 are each powered by a first supply 520 that is set to VDD+VPU. The second inverter P2 502 and N2 506 input is coupled to the output 516 of the first inverter P1 504 and N1 508. A first transistor P3 510 is coupled between the output 518 of the second inverter P2 502 and N2 506 and the VCC output 524 of the circuit. The first transistor P3 510 is controlled by the output 516 of the first inverter P1 504 and N1 508. A second transistor P4 512 is coupled between the second supply, VDD 522, and the VCC output 524 of the circuit 500. This second transistor 512 is controlled by the WL input 514.

The circuit 500 operation is described as follows. When the word line WL 514 is low, or not asserted, then the output 516 of the first inverter P1 504 and N1 508 is VDD+VPU, and the output 518 of the second inverter P2 502 and N2 506 is VSS 540. Therefore, the first transistor P3 510 is OFF, and the second transistor P4 512 is ON. The VCC output 524 is therefore coupled to VDD 522. Alternatively, when WL 514 is high, or asserted, then the output 516 of the first inverter P1 504 and N1 508 is VSS, and the output 518 of the second inverter P2 502 and N2 506 is VDD+VPU. Therefore, the first transistor P3 510 is ON, and the second transistor P4 512 is OFF. The VCC output 524 is therefore coupled to the output 518 of the second inverter P2 502 and N2 506 which is VDD+VPU.

The advantages of the present invention may now be summarized. An effective and very manufacturable method to improve the read margin of a SRAM device is achieved. The read margin of a SRAM device is improved while maintaining a low operational supply voltage. The cell power supply voltage is selectively increased during a reading access to thereby increase the reading margin. A SRAM device is provided having an improved reading margin.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to improve the reading margin in a SRAM memory array comprising:
   providing an array of SRAM cells wherein each said SRAM cell has a power supply terminal;
   forcing a first voltage on said power supply terminal of first said SRAM cell that is selected for reading, wherein said first SRAM cell is one member of a sub-array of said SRAM cells, wherein all said members of said sub-array share common power supply terminal, wherein each said member of said sub-array shares a common word line signal, and wherein said common power supply terminal is controlled by the state of said common word line signal; and
   forcing a second voltage on said power supply terminal of a second said SRAM cell that is not selected for reading wherein said first voltage does not equal said second voltage.

2. The method according to claim 1 wherein said first voltage is larger than said second voltage.

3. The method according to claim 2 wherein said first voltage is between about 1.05 times said second voltage and about 1.3 times said second voltage.

4. The method according to claim 1 wherein said SRAM cells each comprise six transistors.

5. The method according to claim 1 wherein said common power supply terminal is controlled by a select circuit comprising a multiplexer supplying said first voltage when said common word line signal is asserted and supplying said second voltage when said common word line is not asserted.

6. The method according to claim 1 wherein said common power supply terminal is controlled by a select circuit comprising:
   a first inverter having the input coupled to said common word line and powered by said first voltage;
   a second inverter having the input coupled to the output of said second inverter and powered by said first voltage;
   a first transistor coupled between the output of said second inverter and said common power supply terminal wherein said first transistor is controlled by said first inverter output; and
   a second transistor coupled between said second voltage and said common power supply terminal wherein said second transistor is controlled by said common word line.

7. The method according to claim 1 wherein said second SRAM cell is one member of sub-array and wherein no member of said sub-array is selected for reading.

8. A method to improve the reading margin in a SRAM memory array comprising:
   providing an array of SRAM cells wherein each said SRAM cell has a power supply terminal, wherein sub-arrays of said SRAM cells comprise members that share common said power supply terminals, wherein each said member of each said sub-array shares a common word line signal, and wherein said common power supply terminals are controlled by the states of said common word line signals;
   forcing a first voltage on said common power supply terminal of a first said sub-array wherein a member of said first sub-array is selected for reading; and
   forcing a second voltage on said common power supply terminal of a second said sub-array wherein no member of said second sub-array is selected for reading and wherein said first voltage does not equal said second voltage.

9. The method according to claim 8 wherein said first voltage is larger than said second voltage.

10. The method according to claim 9 wherein said first voltage is between about 1.05 times said second voltage and about 1.3 times said second voltage.

11. The method according to claim 8 wherein said SRAM cells each comprise six transistors.

12. The method according to claim 8 wherein said common power supply terminals are controlled by a select circuit comprising a multiplexer supplying said first voltage when said common word line signal is asserted and supplying said second voltage when said common word line is not asserted.

13. The method according to claim 8 wherein said common power supply terminal is controlled by a select circuit comprising:
   a first inverter having the input coupled to said common word line and powered by said first voltage;
   a second inverter having the input coupled to the output of said second inverter and powered by said first voltage;
   a first transistor coupled between the output of said second inverter and said common power supply terminal wherein said first transistor is controlled by said first inverter output; and
   a second transistor coupled between said second voltage and said common power supply terminal wherein said second transistor is controlled by said common word line.

14. A SRAM memory array device comprising:
   an array of SRAM cells wherein each said SRAM cell has a power supply terminal;
   a means of forcing a first voltage on said power supply terminal of a first said SRAM cell that is selected for reading, wherein said first SRAM cells is one member of a sub-array of said SRAM cells, wherein each said member of said sub-array shares a common word line signal, wherein said common power supply terminal is controlled by the states of said common word line signal, and wherein all said members of said sub-array share common power supply terminal; and
   a means of forcing a second voltage on said power supply terminal of a second said SRAM cell that is not selected for reading wherein said first voltage does not equal said second voltage.

15. The device according to claim 14 wherein said first voltage is larger than said second voltage.

16. The device according to claim 15 wherein said first voltage is between about 1.05 times said second voltage and about 1.3 times said second voltage.

17. The device according to claim 14 wherein said SRAM cells each comprise six transistors.

18. The device according to claim 14 wherein said common power supply terminal is controlled by a select circuit comprising a multiplexer supplying said first voltage when said common word line signal is asserted and supplying said second voltage when said common word line is not asserted.

19. The device according to claim 14 wherein said common power supply terminal is controlled by a select circuit comprising:
   a first inverter having the input coupled to said common word line and powered by said first voltage;

a second inverter having the input coupled to the output of said second inverter and powered by said first voltage;

a first transistor coupled between the output of said second inverter and said common power supply terminal wherein said first transistor is controlled by said first inverter output; and a second transistor coupled between said second voltage and said common power supply terminal wherein said second transistor is controlled by said common word line.

20. The device according to claim 14 wherein said second SRAM cell is one member of a sub-array and wherein no member of said sub-array is selected for reading.

21. A method to improve the reading margin in a SRAM memory array comprising:

providing an array of SRAM cells wherein each said SRAM cell has a first power supply terminal and a second power terminal;

forcing a first voltage on said first power supply terminal of a first said SRAM cell that is selected for reading;

forcing a second voltage on said first power supply terminal of a second said SRAM cell that is not selected for reading, wherein said first voltage does not equal said second voltage; and forcing a third voltage on said second power supply terminal of the first and the second said SRAM cells.

22. The method according to claim 21 wherein said first voltage is larger than said second voltage.

23. The method according to claim 21 wherein said third voltage is a ground voltage.

24. The method according to claim 21 wherein said first SRAM cell is one member of a sub-array of said SRAM cells, wherein all said members of said sub-array share common first power supply terminal, wherein each said member of said sub-array shares a common word line signal, and wherein said common first power supply terminal is controlled by the state of said common word line signal.

25. A SRAM memory array device comprising:

an array of SRAM cells wherein each said SRAM cell has a first power supply terminal and a second power supply terminal;

a means of forcing a first voltage on said first power supply terminal of a first said SRAM cell that is selected for reading;

a means of forcing a second voltage on said first power supply terminal of a second said SRAM cell that is not selected for reading wherein said first voltage does not equal said second voltage; and a means of forcing a third voltage on said second power supply terminal of the first and the second said SRAM cells.

26. The device according to claim 25 wherein said first voltage is larger than said second voltage.

27. The device according to claim 25 wherein said third voltage is a ground voltage.

28. The device according to claim 25 wherein said first SRAM cell is one member of a sub-array of said SRAM cells, wherein each said member of said sub-array shares a common word line signal, wherein said common power supply terminal is controlled by the states of said common word line signal, and wherein all said members of said sub-array share common power supply terminal.

* * * * *